United States Patent
Lin et al.

(10) Patent No.: US 9,768,132 B2
(45) Date of Patent: Sep. 19, 2017

(54) SEMICONDUCTOR STRUCTURE AND METHOD OF FORMING THE SAME

(75) Inventors: Ling Mei Lin, Tainan (TW); Chun Li Wu, Tainan (TW); Yung-Fa Lee, Tainan (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 280 days.

(21) Appl. No.: 13/420,342

(22) Filed: Mar. 14, 2012

(65) Prior Publication Data
US 2013/0241064 A1   Sep. 19, 2013

(51) Int. Cl.
*H01L 23/00*   (2006.01)
*H01L 23/522*   (2006.01)

(52) U.S. Cl.
CPC .............. *H01L 24/03* (2013.01); *H01L 24/05* (2013.01); *H01L 23/522* (2013.01); *H01L 2224/02166* (2013.01); *H01L 2224/05093* (2013.01); *H01L 2224/05546* (2013.01); *H01L 2224/05553* (2013.01); *H01L 2924/1306* (2013.01); *H01L 2924/13091* (2013.01)

(58) Field of Classification Search
CPC .............. H01L 2224/02; H01L 2224/04; H01L 2224/05; H01L 2224/06; H01L 2224/12; H01L 2224/13; H01L 2224/14
See application file for complete search history.

(56) References Cited

U.S. PATENT DOCUMENTS

| | | | | |
|---|---|---|---|---|
| 6,144,099 A | * | 11/2000 | Lopatin | H01L 21/288 257/751 |
| 6,218,732 B1 | * | 4/2001 | Russell | H01L 24/02 257/748 |
| 6,597,069 B1 | * | 7/2003 | Degani | H01L 24/11 257/643 |
| 6,838,774 B2 | * | 1/2005 | Patti | H01L 21/76898 257/737 |

(Continued)

FOREIGN PATENT DOCUMENTS

CN    101789391    7/2010
TW    201133738    10/2011

(Continued)

OTHER PUBLICATIONS

Search Report dated Jul. 9, 2016 from corresponding No. TW 101144934.

(Continued)

*Primary Examiner* — David Zarneke
(74) *Attorney, Agent, or Firm* — Hauptman Ham, LLP

(57) ABSTRACT

A semiconductor structure includes a substrate, a bond pad over the substrate, and a passivation layer over the substrate and a peripheral region of the bond pad. The bond pad has a bonding region and the peripheral region surrounding the bonding region. The passivation layer has an opening defined therein, and the opening exposes the bonding region of the bond pad. A first vertical distance between an upper surface of the passivation layer and a surface of the bonding region ranges from 30% to 40% of a second vertical distance (Continued)

between a lower surface of the passivation layer and an upper surface of the peripheral region.

20 Claims, 10 Drawing Sheets

(56) References Cited

U.S. PATENT DOCUMENTS

| | | | | |
|---|---|---|---|---|
| 2002/0137330 A1* | 9/2002 | Ryan | ............... | H01L 21/76843 |
| | | | | 438/628 |
| 2010/0295044 A1* | 11/2010 | Homma et al. | ............... | 257/48 |
| 2011/0241184 A1* | 10/2011 | Han | ............... | H01L 21/02126 |
| | | | | 257/640 |

FOREIGN PATENT DOCUMENTS

| | | |
|---|---|---|
| WO | 2011017044 | 2/2011 |
| WO | 2011107044 | 9/2011 |

OTHER PUBLICATIONS

Office Action dated Jul. 13, 2016 from corresponding No. TW 101144934.

* cited by examiner

SEMICONDUCTOR STRUCTURE AND METHOD OF FORMING THE SAME

BACKGROUND

Modern integrated circuits (ICs) are made up of literally millions of active devices such as transistors and capacitors. These devices are initially formed individually on a substrate, but are later interconnected together to form functional circuits. Typical interconnection structures include lateral interconnections, such as metal lines (wirings), and vertical interconnections, such as via plugs. On top of the interconnection structures, bond pads are formed and exposed on the surface of the respective chip. Electrical connections are made through bond pads to connect the chip to a package substrate or another die.

DESCRIPTION OF THE DRAWINGS

One or more embodiments are illustrated by way of examples, and not by limitation, in the figures of the accompanying drawings, wherein elements having the same reference numeral designations represent like elements throughout and wherein.

DETAILED DESCRIPTION

Figure 1:
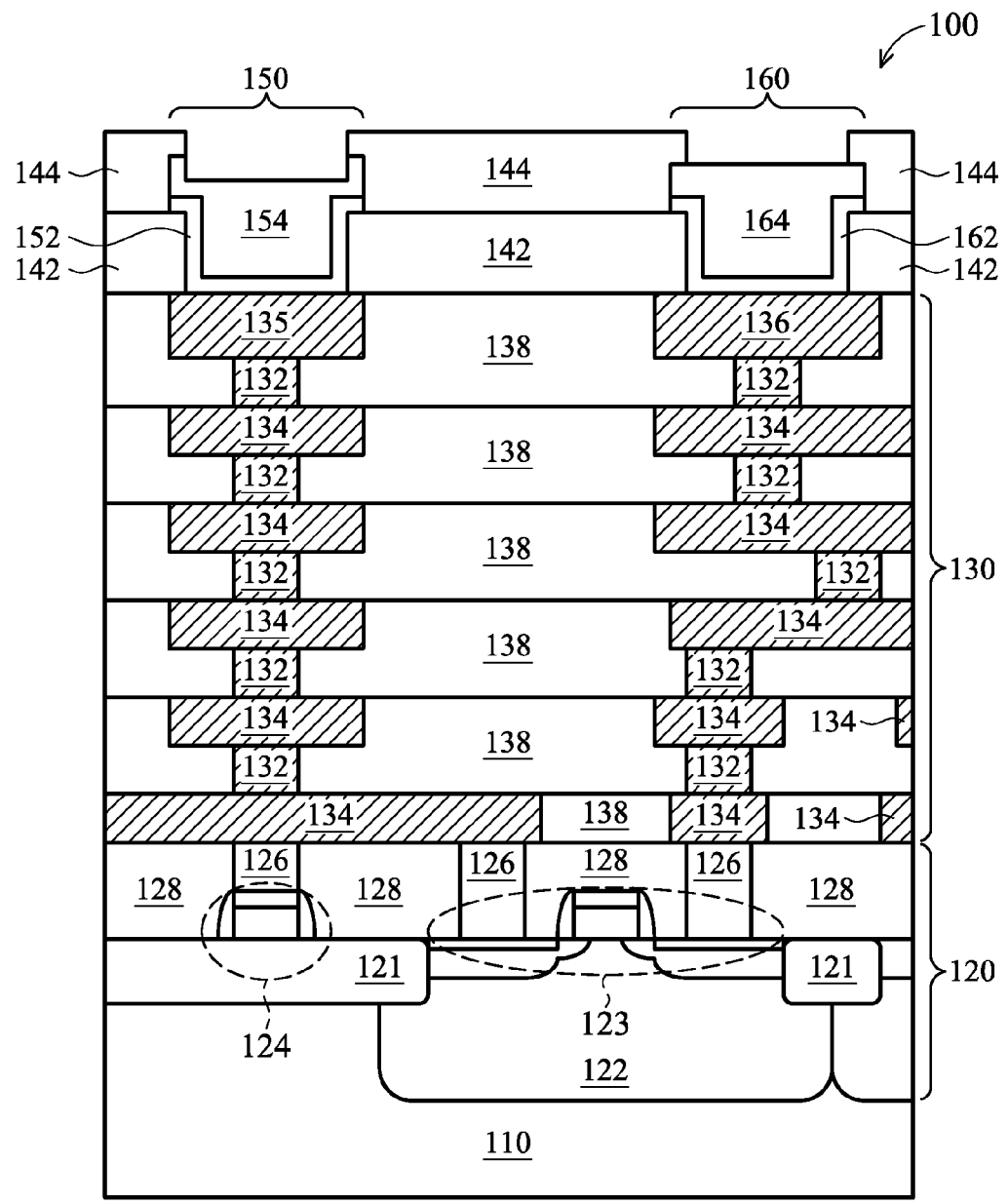
FIG. 1 is a cross-sectional view of a portion of a semiconductor device in accordance with one or more embodiments.

It is understood that the following disclosure provides many different embodiments, or examples, for implementing different features of the disclosure. Specific examples of components and arrangements are described below to simplify the present disclosure. These are, of course, examples and are not intended to be limiting. In accordance with the standard practice in the industry, various features in the drawings are not drawn to scale and are used for illustration purposes only.

The formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "below," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

FIG. 1 is a cross-sectional view of a portion of a semiconductor device 100 in accordance with one or more embodiments. The semiconductor device 100 has a substrate 110, a component layer 120 over the substrate 110, an interconnection structure 130 over the component layer 120, passivation layers 142 and 144 over the interconnection structure 130, and bond pads 150 and 160 over the interconnection structure 130 and surrounded by the passivation layers 142 and 144.

In some embodiments, the substrate 110 includes: an elementary semiconductor such as silicon or germanium in crystal, polycrystalline, or an amorphous structure; a compound semiconductor including silicon carbide, gallium arsenide, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In at least one embodiment, the substrate 102 is an alloy semiconductor substrate having a gradient SiGe feature in which the Si and Ge composition change from one ratio at one location to another ratio at another location of the gradient SiGe feature. In another embodiment, the alloy SiGe is formed over a silicon substrate. In yet another embodiment, a SiGe substrate is strained. In some further embodiments, the semiconductor substrate 110 is a semiconductor on insulator. In some examples, the semiconductor substrate 110 includes a doped epi layer or a buried layer. In other examples, the compound semiconductor substrate has a multilayer structure, or the substrate includes a multilayer compound semiconductor structure.

The component layer 120 includes insulation structures, such as shallow trench insulation (STI) structures 121, and doped wells 122 separated by the STI structures 121. The component layer 120 also includes active devices, such as a metal-oxide semiconductor field effect transistor ("MOS transistor") 123, positioned in the doped wells 122, and passive components, such as a polycrystalline silicon resistor 124, positioned over the STI structure 121. In addition, the component layer 120 includes conductive posts 126 connecting the active devices and/or passive components to the interconnection layer 130. A dielectric layer 128 is over the active devices and passive components and surrounding the conductive posts 126.

In some embodiments, the conductive posts 126 are made of a material including tungsten, copper, aluminum, or combinations thereof. In some embodiments, the dielectric layer 128 includes a material having a dielectric constant lower than that of silicon (also referred to as a low-k material), such as phosphosilicate glass (PSG), borophosphosilicate glass (BPSG), or pre-metal dielectric (PMD).

The interconnection structure 130 includes conductive via plugs 132 and conductive lines 134 stacked one layer over another, a redistribution layer having redistribution structures 135 and 136, and a plurality of dielectric layers 138 positioned over the component layer 120 and filling the space among the conductive via plugs 132, conductive lines 134, and redistribution structures 135 and 136. The conductive via plugs 132, conductive lines 134, and the redistribution structures 135 and 136 are arranged to electrically connect the active devices and/or passive components in the component layer 120 with one another and to the bond pads 150 and 160.

In some embodiments, the redistribution structures 135 and 136 have a greater thickness than the other conductive lines in the interconnection structure 130. In at least one embodiment, the redistribution structures 135 and 136 are made of a material different from that of the conductive lines 134 and conductive via plugs 132. In some embodiments, the plurality of dielectric layers 138 includes a low-k material.

The passivation layers 142 and 144 are usable for protecting the interconnection structure 130, the component layer 120, and the substrate 110 from direct exposure to factors, such as humidity and/or certain chemical compounds, that are hazardous to the semiconductor device 100. In some embodiments, the passivation layers 142 and 144 include oxide and/or SiN. In at least one embodiment, the passivation layer 142 is omitted.

In some embodiments, the bond pads 150 and 160 are also referred to as pad structures. The bond pads 150 and 160 include barrier layer 152 and 162 and pad bodies 154 and 164 over the corresponding barrier layers 152 and 162. The barrier layers 152 and 162 are usable for preventing electrical migration or diffusion of metallic atoms from the pad bodies 154 and 164 into the interconnection structure 130, the component layer 120, and/or the substrate 110. In some embodiments, the barrier layers 152 and 162 are omitted. In some embodiments, the pad bodies 154 and 164 have multilayer structures. In some embodiments, the pad bodies 154 and 164 include copper, aluminum, or copper-aluminum alloy. The bond pads 150 and 160 depicted in FIG. 1 have slightly different structures. In at least one embodiment, only bond pads having a structure similar to one of either bond pad 150 or bond pad 160 are implemented in a single semiconductor device (such as the semiconductor device 100).

Bridging between adjacent bond pads (such as between bond pads 150 and 160) and/or deformation of sidewalls of the pad openings (such as openings 231a and 231b in FIG. 2A) during a wire-bonding process or a bump process increases the risk of short-circuit of the adjacent bond pads. By increasing the heights of the sidewalls of the opening, the risk of shorting adjacent bond pads decreases, and thus the bond pads may be positioned closer to each other.

Figure 2A:
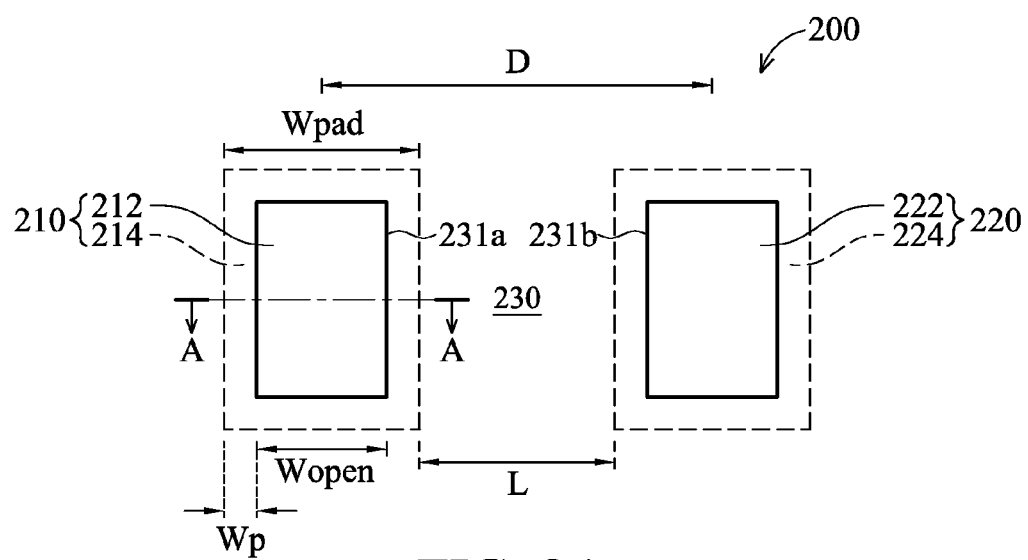
FIG. 2A is a top view of two bond pads of a semiconductor device in accordance with one or more embodiments.

FIG. 2A is a top view of two bond pads 210 and 220 of a semiconductor device 200 in accordance with one or more embodiments. In some embodiments, the semiconductor device 200 is the semiconductor device 100 in FIG. 1. The bond pad 210 and the bond pad 220 are aligned along an in-line direction L and partially covered by a passivation layer 230. In some embodiments, the passivation layer 230 includes the passivation layer 142 and the passivation layer 144 in FIG. 1. Although only two bond pads 210 and 220 are depicted in FIG. 2A, in some embodiments, there are more than two bond pads in the semiconductor device 200.

The bond pads 210 and 220 have an in-line pitch D, which is measurable as a distance between a center of the bond pad 210 and a center of the bond pad 220. In some embodiments, the in-line pitch D ranges from 35 µm to 180 µm. The bond pad 210 has a bonding region 212 and a peripheral region 214 surrounding the bonding region 212. The passivation layer 230 is positioned over the peripheral region 214 of the bond pad 210 and has an opening 231a exposing the bonding region 212. The bond pad 220 also has a bonding region 222 and a peripheral region 224 surrounding the bonding region 222. The passivation layer 230 also covers the peripheral region 224 of the bond pad 220 and has an opening 231b exposing the bonding region 222.

Along the in-line direction L, the bond pad 210 has a pad width $W_{pad}$, the opening defined in the passivation layer 230 and exposing the bonding region 212 has an opening width $W_{open}$, and the peripheral region 214 has a periphery width $W_p$, where the pad width $W_{pad}$, the opening width $W_{open}$, and the periphery width $W_p$ have a relationship of: $W_{pad}=W_{open}+2*W_p$. In some embodiments, the pad width $W_{pad}$ ranges from 30 µm to 90 µm, the opening width $W_{open}$ ranges from 28 µm to 88 µm, and the periphery width $W_p$ ranges from 1.0 µm to 32 µm.

Figure 2B:
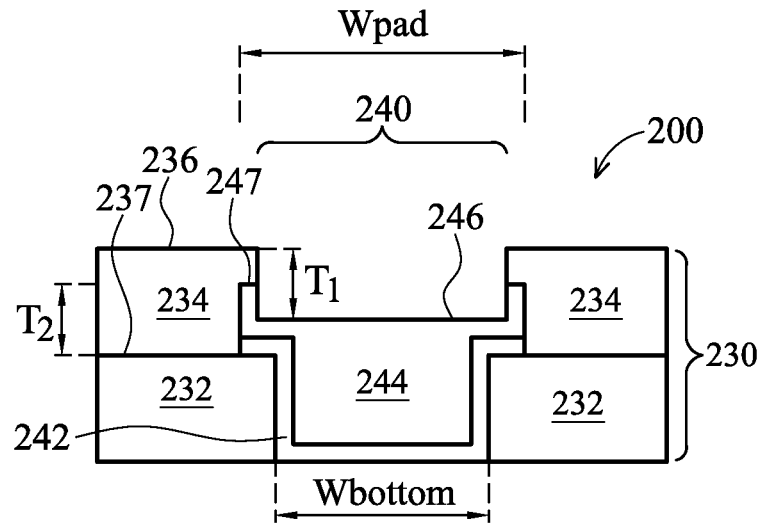
FIGS. 2B and 2C are cross-sectional views, taken from line A of FIG. 2A, of example bond pads in accordance with one or more embodiments.

FIG. 2B is a cross-sectional view, taken from line A of FIG. 2A, of a semiconductor device 200 having a first example bond pad 240, usable as the bond pad 210 in FIG. 2A, in accordance with one or more embodiments. Structures corresponding to the substrate 110, the component layer 120, and the interconnection structure 130 depicted in FIG. 1 are omitted in FIG. 2B for clarity of the disclosure. The passivation layer 230 includes a first passivation layer 232 over the interconnection structure 130 (FIG. 1) and a second passivation layer 234 over an upper surface 236 of the first passivation layer 232. The first passivation layer 232 has a first opening (such as opening 443 in FIG. 4B), and the second passivation layer 234 has a second opening (such as opening 449 in FIG. 4F) overlaying the first opening. The first and second openings expose a portion of an upper surface of the redistribution structure 135 (FIG. 1).

The bond pad 240 includes a barrier layer 242 and a pad body 244 over the barrier layer 242. The barrier layer 242 is positioned along side walls of the first opening defined in the first passivation layer 232 and the exposed upper surface of the redistribution structure 135 (FIG. 1). The pad body 244 is partially surrounded by the first passivation layer 232 and partially surrounded by the second passivation layer 234. In some embodiments, the barrier layer 242 is omitted. The bond pad 240 thus has a lower portion at about the same horizontal level as the first passivation layer 232 and an upper portion at about the same horizontal level as the second passivation layer 234. Along the in-line direction L, the upper portion of the bond pad 240 has a width the same as the pad width $W_{pad}$, and the lower portion of the bond pad 240 has a width $W_{bottom}$ smaller than the pad width $W_{pad}$. In some embodiments, the width $W_{bottom}$ ranges from 80% to 95% of the pad width $W_{pad}$.

The bond pad 240 has a first vertical distance $T_1$ between the upper surface 236 of the second passivation layer 234 and a surface 246 of the bonding region of the bond pad 240. The bond pad 240 has a second vertical distance $T_2$ between a lower surface 237 of the second passivation layer 234 and an upper surface 247 of the peripheral region of the bond pad 240. The surface 246 is lower than the upper surface 247. In some embodiments, the first vertical distance $T_1$ ranges from 30% to 40% of the second vertical distance $T_2$.

Figure 2C:
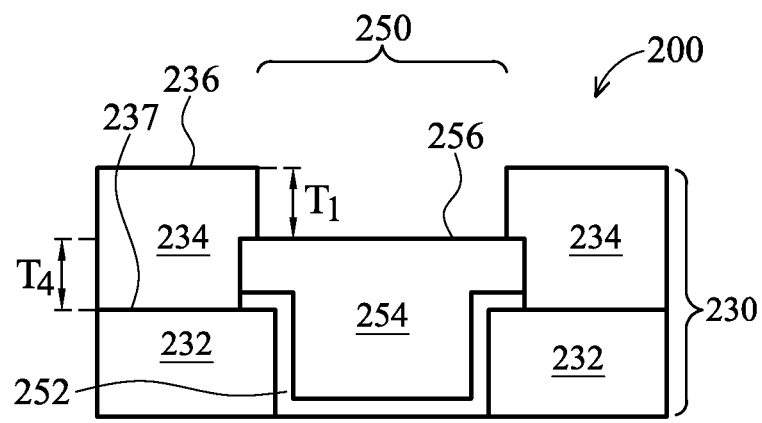

FIG. 2C is a cross-sectional view, taken from line A of FIG. 2A, of a semiconductor device 200 having a second example bond pad 250, usable as the bond pad 210 in FIG. 2A, in accordance with one or more embodiments. The structures corresponding to the substrate 110, the component layer 120, and the interconnection structure 130 are omitted in FIG. 2C for clarity of the disclosure.

Compared with the first example depicted in FIG. 2B, the bond pad 250 includes a barrier layer 252 and a pad body 254 over the barrier layer 252. The pad body 254 has a lower portion surrounded by the first passivation layer 232 and an upper portion surrounded by the second passivation layer 234. The supper surfaces of the edge portion of the bond pad 250 covered by the second passivation layer 234 and the bonding portion of the bond pad 250 are level with each other (i.e., defining an upper surface 256 of the bond pad 250).

The bond pad 250 has a third vertical distance $T_3$ between an upper surface 236 of the second passivation layer 234 and the upper surface 256 of the bond pad 250. The bond pad 250 has a fourth vertical distance $T_4$ between a lower surface 237 of the second passivation layer 234 and the upper surface 256 of the bond pad 240. In some embodiments, the third vertical distance $T_3$ ranges from 30% to 40% of the fourth vertical distance $T_4$.

Compared with a bond pad whose $T_1$ is less than 30% of $T_2$ or whose $T_3$ is less than 30% of $T_4$, the embodiments depicted in FIGS. 2B and 2C are capable of better bond wire retention within pad openings, defined by the passivation layer 230 and the exposed bonding regions 212 and 222, and thus less vulnerable to pad bridging between adjacent bond pads (such as between bond pads 210 and 220) and/or deformation of sidewalls of the pad opening during a wire-bonding process or a bump process. Therefore, in some embodiments, the embodiments depicted in FIGS. 2B and 2C are capable of having a smaller in-line pitch D than the bond pad whose $T_1$ is less than 30% of $T_2$ or whose $T_3$ is less than 30% of $T_4$.

Figure 3:
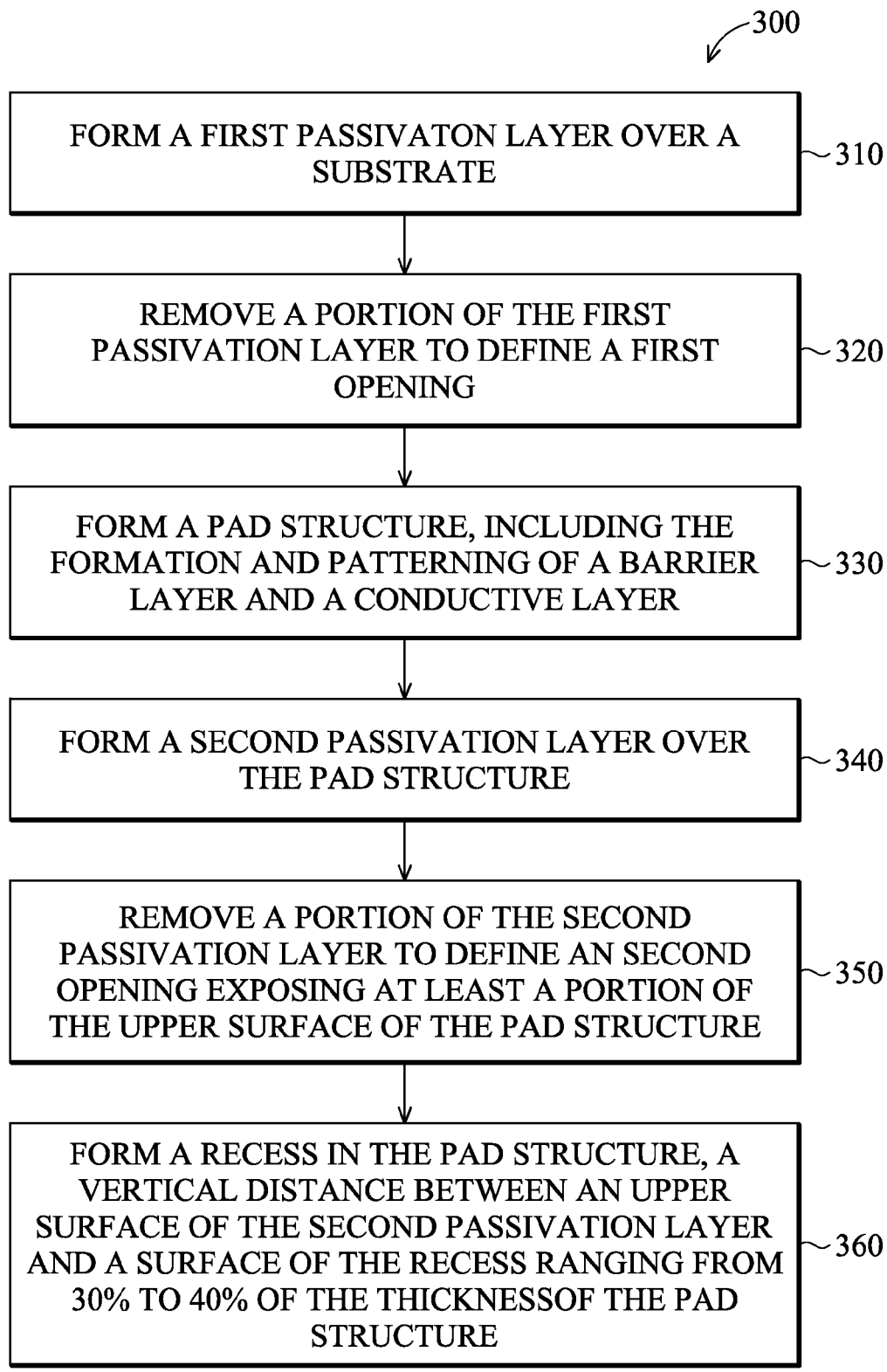
FIG. 3 is a flow chart of a method of making a bond pad depicted in FIG. 2B in accordance with one or more embodiments.

FIG. 3 is a flow chart of a method 300 of making a bond pad 240 depicted in FIG. 2B in accordance with one or more embodiments. FIGS. 4A-4F are cross-sectional views of a semiconductor device 400 having a bond pad 450 (FIG. 4F) at various manufacturing stages. The bond pad 450 corresponds to the bond pad 240 depicted in FIG. 2B and the bond pad 150 depicted in FIG. 1.

Figure 4A:
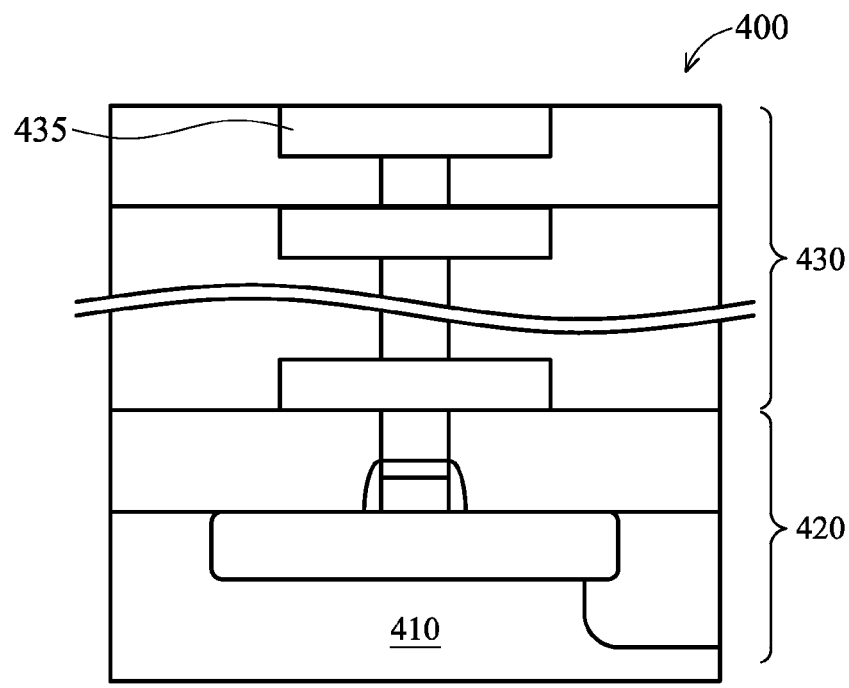
FIGS. 4A-4F are cross-sectional views of a semiconductor device having a bond pad at various manufacturing stages in accordance with one or more embodiments.

As depicted in FIG. 4A, the semiconductor device 400 has a substrate 410, a component layer 420 over the substrate 410, and an interconnection structure 430 over the component layer 420. The interconnection structure 430 includes, among other things, a redistribution structure 435 at the top-most layer of the interconnection structure 430. The substrate 410, the component layer 420, the interconnection structure 430, and the redistribution structure 435 are the same or similar to the substrate 110, the component layer 120, the interconnection structure 130, and the redistribution structure 135 depicted in FIG. 1. Accordingly, detailed explanations with regard to the substrate 410, the component layer 420, the interconnection structure 430, and the redistribution structure 435 are not repeated.

Figure 4B:
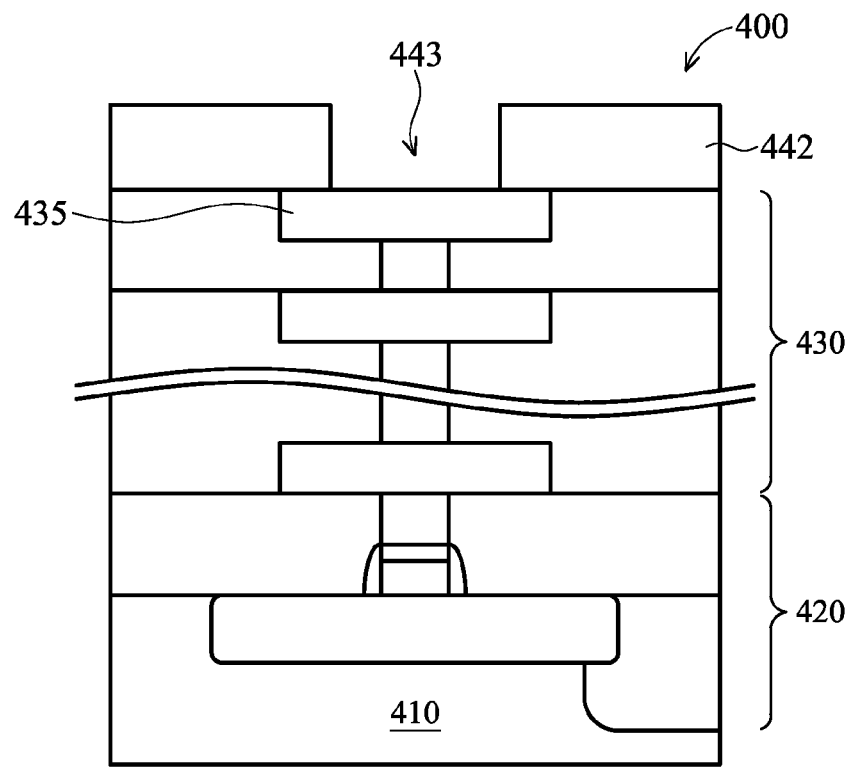

As depicted in FIGS. 3 and 4B, in operation 310, a first passivation layer 442 is formed over the substrate 410, the component layer 420, and the interconnection structure 430. The first passivation layer 442 is formed by performing a Chemical vapor Deposition (CVD) process or a Physical Vapor Deposition (PVD) process. In some embodiments, the first passivation layer 442 includes silicon oxide, silicon nitride, or titanium dioxide. In at least one embodiment, the first passivation layer 442 has a thickness ranging from 0.6 µm to 1.2 µm.

Returning to FIG. 3, in operation 320, a portion of the first passivation layer 442 is removed to define an opening 443 (FIG. 4B). The opening 443 exposes a portion of the redistribution structure 435. In some embodiments, the formation of the opening 443 includes first forming a patterned mask layer over the first passivation layer 442, and subsequently performing a dry etching process or a wet etching process to remove the portion of the first passivation layer 442 not protected by the patterned mask layer. The patterned mask is removed by an ashing process after the formation of the opening 443. In at least one embodiment, the first passivation layer 442 is omitted, and thus operations 310 and 320 are omitted.

Figure 4C:
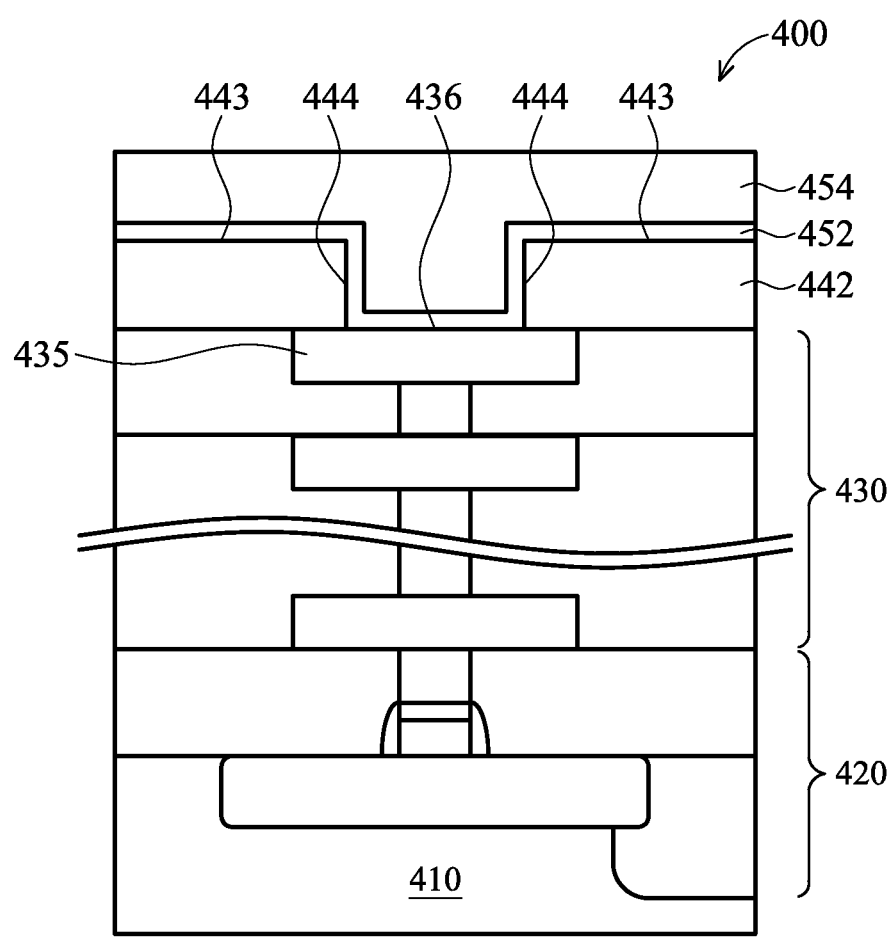

As depicted in FIGS. 3 and 4C, in operation 330, a barrier layer 452 and a conductive layer 454 are formed over the interconnection structure 430 and the first passivation layer 442. The barrier layer 452 and the conductive layer 454 fill the opening 443 and electrically connect to the redistribution layer 435.

The barrier layer 452 is first deposited along an upper surface 443 and side walls 444 of the first passivation layer 442 and an exposed portion of an upper surface 436 of the redistribution structure 435. In some embodiments, the formation of the barrier layer 452 includes performing a CVD process, a PVD process, or a plasma-enhanced CVD (PECVD) process. In at least one embodiment, the barrier layer 452 includes tungsten (W), tantalum (Ta), tantalum nitride (TaN), titanium nitride (TiN), or combinations thereof. In some embodiments, the barrier layer 452 is omitted. In some embodiments, the conductive layer 454 is formed by performing a CVD process, a PVD process, a Damascene process, an electrochemical plating deposition, or an ion beam deposition. In some embodiments, the conductive layer 454 includes copper, aluminum, aluminum-copper alloy, or titanium-aluminum alloy.

Figure 4D:
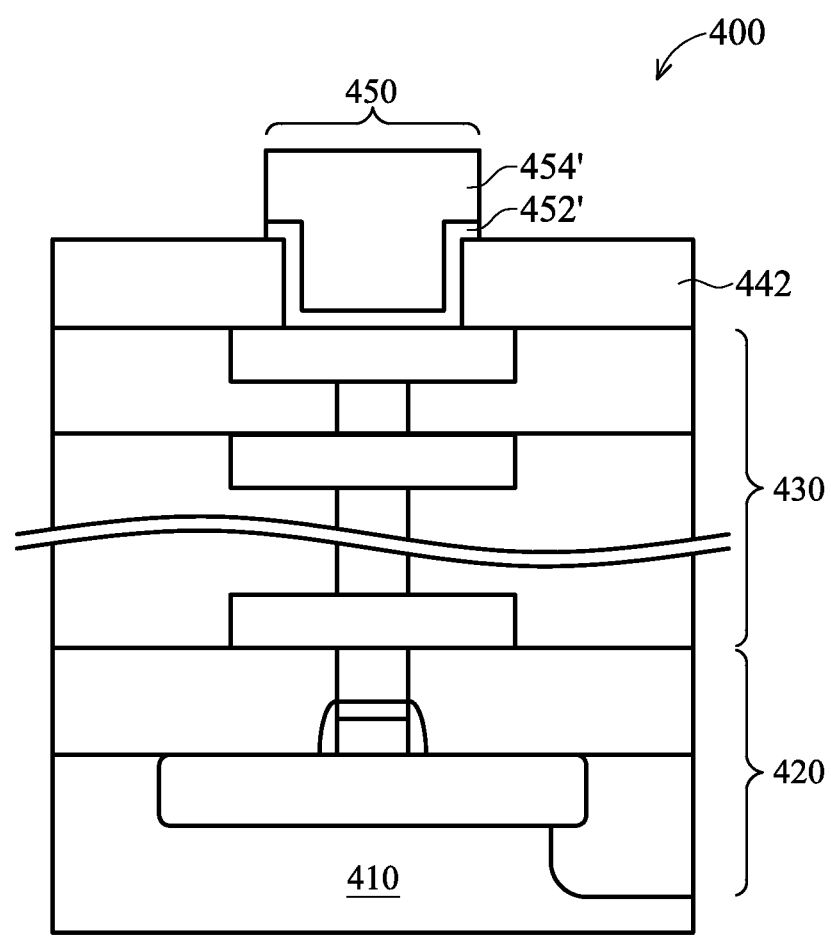

As depicted in FIGS. 3 and 4D, in operation 330, the barrier layer 452 and a conductive layer 454 are further patterned to form a bond pad structure 450. The barrier layer 452 is patterned to form a patterned barrier layer 452', and the conductive layer 454 is patterned to form a pad body 454'.

Figure 4E:
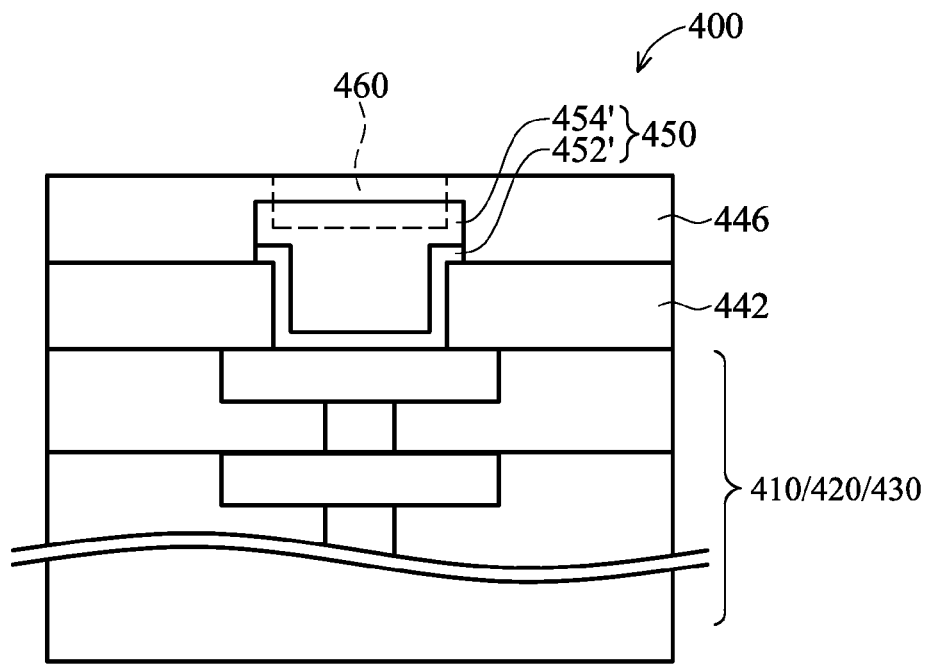

As depicted in FIGS. 3 and 4E, in operation 340, a second passivation layer 446 is formed over the first passivation layer 442 and the bond pad structure 450. The second passivation layer 446 is formed by performing a CVD process or a PVD process. In some embodiments, the second passivation layer 446 includes silicon oxide, silicon nitride, or titanium dioxide. In at least one embodiment, the second passivation layer 446 has a thickness (measurable from a position not over the bond pad structure 450) ranging from 0.8 µm to 2.5 µm. As depicted in FIG. 4E, in order to make a bond pad having a structure similar to the embodiment depicted in FIG. 2B, the dotted region 460 will be removed.

Figure 4F:
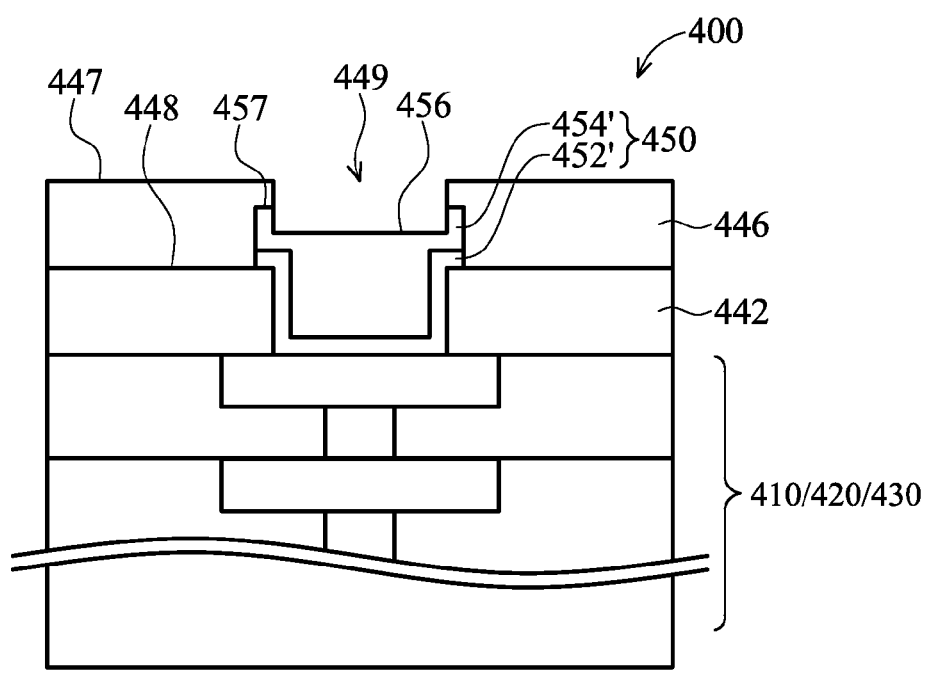

As depicted in FIGS. 3 and 4F, in operation 350, a portion of the second passivation layer 446 is removed to define a second opening 449 (occupying an upper portion of the dotted region 460 in FIG. 4E).

Then, returning to FIG. 3, in operation 360, a recess (occupying a lower portion of the dotted region 460 in FIG. 4E) is formed in the bond pad structure 450. In some embodiments, the formation of the recess includes forming a patterned mask over the bond pad structure 450 and the passivation layer 446, and the patterned mask exposes the portion of the pad structure exposed by the opening. Then, an etching process is performed on the portion of the bond pad structure 450 exposed by the opening. In some embodiments, the etching process is performed by performing a wet etching process or a dry etching process for a predetermined period of time.

As depicted in FIG. 3 and FIG. 4F, the dotted region 460 is removed by performing operations 350 and operation 360. In some embodiments, the removal of the dotted region 460 is performed by a single etching process, and thus operations 350 and operation 360 are consolidated as a single operation.

As described above in conjunction with FIG. 2B, a thickness of the bond pad structure 450 above the first passivation layer 442 is defined as a distance between a lower surface 448 of the second passivation layer 446 and an upper surface 457 of the bond pad structure 450 at a peripheral region. A vertical distance between an upper surface 447 of the second passivation layer 446 and a surface 456 of the recess (which defines a bonding region) ranges from 30% to 40% of the thickness of the bond pad structure 450.

Figure 5:
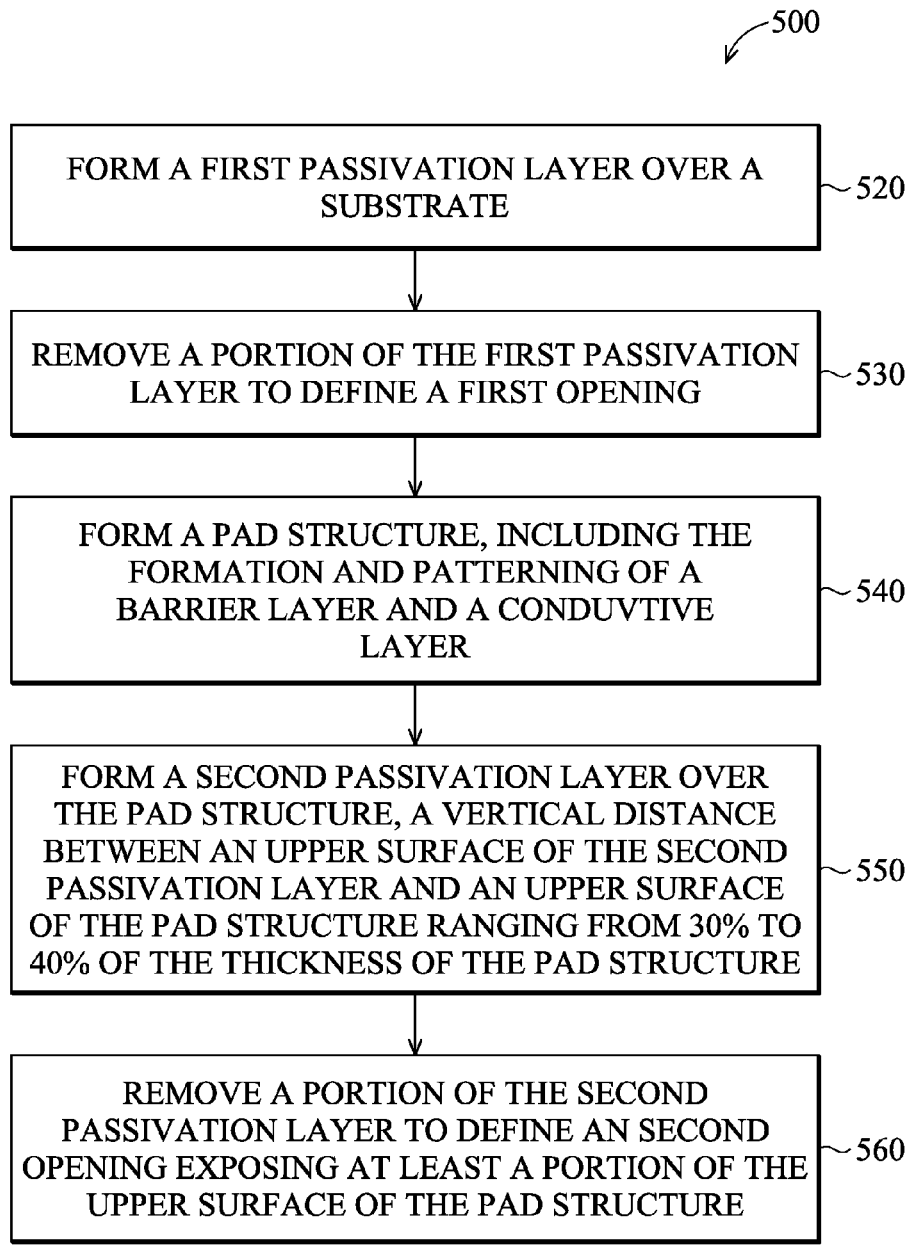
FIG. 5 is a flow chart of a method of making a bond pad depicted in FIG. 2C in accordance with one or more embodiments.
Figure 6A:
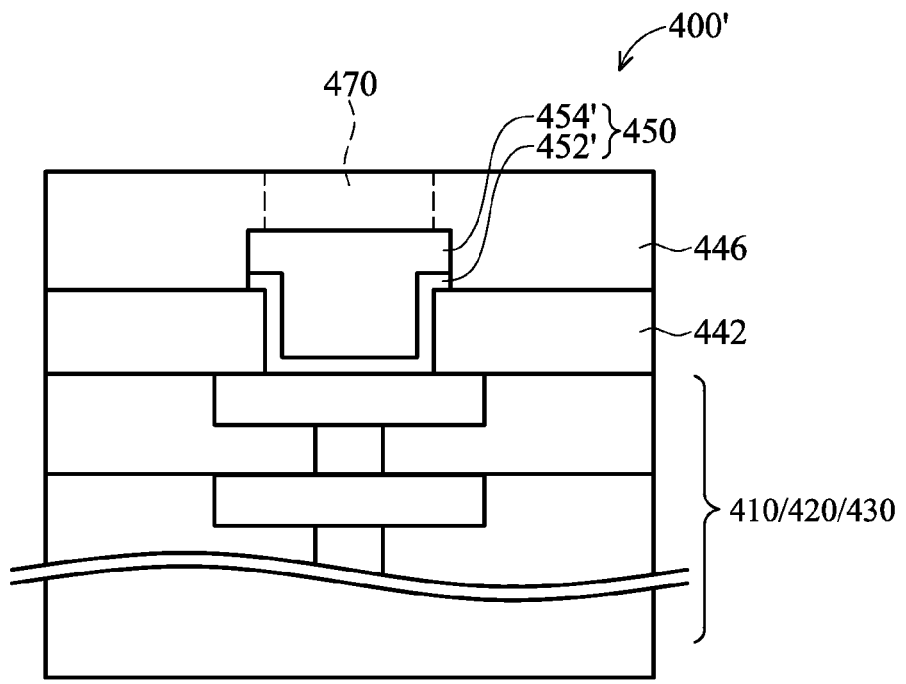
FIGS. 6A-6B are cross-sectional views of a semiconductor device having a bond pad at various manufacturing stages in accordance with one or more embodiments.
Figure 6B:
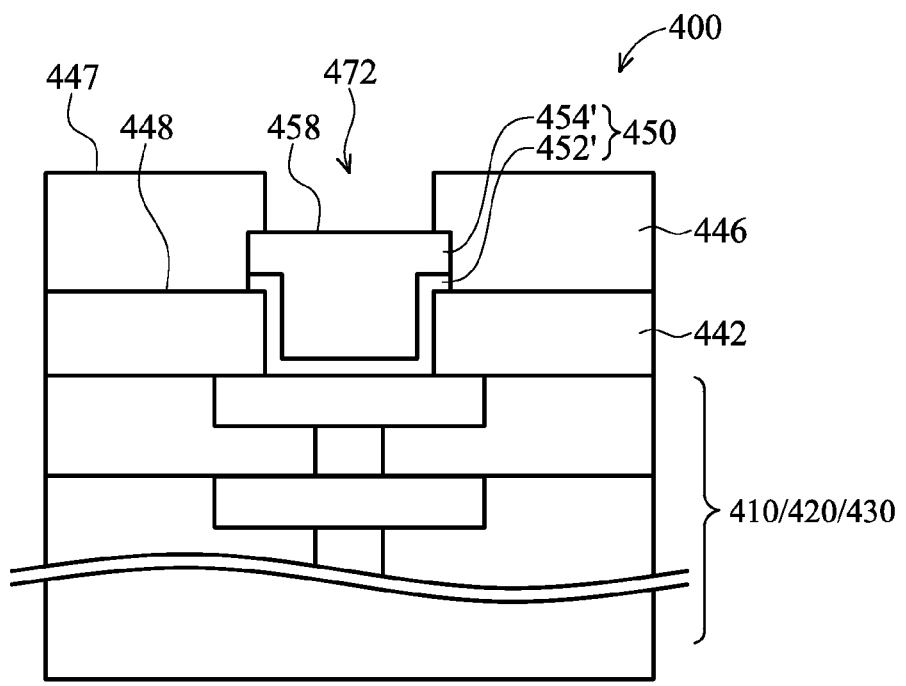

FIG. 5 is a flow chart of a method 500 of making a bond pad 250 depicted in FIG. 2C in accordance with one or more embodiments. FIGS. 6A-6B are cross-sectional views of a semiconductor device 400' having a bond pad 450' (FIG. 6B) at various manufacturing stages. The bond pad 450' corresponds to the bond pad 250 depicted in FIG. 2C and the bond pad 160 depicted in FIG. 1.

As depicted in FIG. 5, operations 510, 520, and 530 correspond to operations 310, 320, and 330 in FIG. 3, respectively. Accordingly, the descriptions of operations 510-530 are not repeated. Also, the semiconductor device 400' in FIGS. 6A-6B differs from the semiconductor device 400 in FIG. 4A-4F after operation 530, which corresponds to FIG. 4D. Thus, for the illustration of the manufacturing of semiconductor device 400', FIG. 6A follows the structure depicted in FIG. 4D.

As depicted in FIGS. 5 and 6A, in operation 540, a second passivation layer 446 is formed over the first passivation layer 442 and the bond pad structure 450. As depicted in FIG. 6A, in order to make a bond pad having a structure similar to the embodiment depicted in FIG. 2C, the dotted region 470 of the second passivation layer 446 will be removed.

As depicted in FIGS. 5 and 6F, in operation 550, a portion of the second passivation layer 446 is removed to define a second opening 472. As described above in conjunction with FIG. 2C, a thickness of the bond pad structure 450 above the first passivation layer 442 is defined as a distance between a lower surface 448 of the second passivation layer 446 and an upper surface 458 of the bond pad structure 450. A vertical distance between an upper surface 447 of the second passivation layer 446 and the upper surface 458 of the bond pad structure 450 ranges from 30% to 40% of the thickness of the bond pad structure 450.

In accordance with some embodiments, a semiconductor structure includes a substrate, a bond pad over the substrate, and a passivation layer over the substrate and a peripheral region of the bond pad. The bond pad has a bonding region and the peripheral region surrounding the bonding region. The passivation layer has an opening defined therein, and the opening exposes the bonding region of the bond pad. A first vertical distance between an upper surface of the passivation layer and a surface of the bonding region ranges from 30% to 40% of a second vertical distance between a lower surface of the passivation layer and an upper surface of the peripheral region.

In accordance with some embodiments, a method of manufacturing a semiconductor structure includes forming a pad structure over a substrate. A passivation layer is formed over the pad structure, and the pad structure has a thickness defined as a distance between a lower surface of the passivation layer and an upper surface of the pad structure. A portion of the passivation layer is removed to define an opening, and the opening exposes at least a portion of the upper surface of the pad structure. A recess is formed in the pad structure by removing a portion of the pad structure exposed by the opening defined in the passivation layer. A vertical distance between an upper surface of the passivation layer and a surface of the recess ranges from 30% to 40% of the thickness of the pad structure.

In accordance with some embodiments, a method of manufacturing a semiconductor structure includes forming a pad structure over a substrate. A passivation layer is formed over the pad structure, and the pad structure has a thickness defined as a distance between a lower surface of the passivation layer and an upper surface of the pad structure. The passivation layer has an opening defined therein, and the opening exposes at least a portion of the upper surface of the pad structure. A vertical distance between an upper surface of the passivation layer and upper surface of the pad structure ranges from 30% to 40% of the thickness of the pad structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure comprising:
a bond pad over a substrate, the bond pad having a bonding region and a peripheral region surrounding the bonding region, wherein the bonding region is recessed relative to the peripheral region; and
a passivation layer over the peripheral region of the bond pad and extending laterally over the substrate, the passivation layer having an opening defined therein, and the opening exposing the bonding region of the bond pad, the passivation layer having an upper surface and a lower surface, and an entirety of the upper surface being higher than the bond pad, wherein a width of the opening is greater than a width of a bottom surface of the bond pad,
a first vertical distance between the upper surface of the passivation layer and a surface of the bonding region ranging from 30% to 40% of a second vertical distance between the lower surface of the passivation layer and an upper surface of the peripheral region of the bond pad, and the opening of the passivation layer and bonding region of the bond pad defining a pad opening configured for bond wire retention.

2. The semiconductor structure of claim 1, wherein the bond pad and another bond pad formed over the substrate have an in-line pitch ranging from 35 µm to 80 µm.

3. The semiconductor structure of claim 1, wherein the peripheral region has a width ranging from 1.0 µm to 32 µm.

4. The semiconductor structure of claim 1, wherein the width of the opening ranges from 28 µm to 88 µm.

5. The semiconductor structure of claim 1, wherein the second vertical distance ranges from 0.8 µm to 25 µm.

6. The semiconductor structure of claim 1, wherein the bond pad comprises a barrier layer and a pad body over the barrier layer.

7. The semiconductor structure of claim 6, wherein the pad body comprises copper, aluminum, or aluminum-copper alloy.

8. The semiconductor structure of claim 1, wherein the bond pad comprises a barrier layer and a pad body over the barrier layer.

9. The semiconductor structure of claim 8, wherein a maximum horizontal length between sidewalls of the barrier layer ranges from 80% to 95% of a maximum horizontal length of the bond pad.

10. The semiconductor structure of claim 8, wherein the pad body comprises copper, aluminum, or aluminum-copper alloy.

11. The semiconductor structure of claim 1, wherein the passivation layer directly contacts an upper most surface of the bond pad.

12. A method of manufacturing a semiconductor structure, comprising:
forming a pad structure over a substrate, the pad structure having a peripheral region and a bonding region;
forming a passivation layer over the pad structure and extending laterally over the substrate, the passivation layer having an upper surface and a lower surface, and an entirety of the upper surface being higher than the pad structure, the peripheral region of the pad structure having a thickness defined as a distance between the lower surface of the passivation layer and an upper surface of the peripheral region of the pad structure;
removing a portion of the passivation layer to define an opening, the opening exposing at least an upper surface of the bonding region of the pad structure, and
recessing the pad structure to define the bonding region having a width greater than a width of a bottom surface of the pad structure, and
a vertical distance between the upper surface of the passivation layer and upper surface of the bonding region of the pad structure ranging from 30% to 40% of the thickness of the peripheral region of the pad structure, and the opening of the passivation layer and the bonding region of the pad structure defining a pad opening configured for bond wire retention.

13. The method of claim 12, further comprising:
forming another passivation layer over the substrate prior to the formation of the pad structure; and
removing a portion of the another passivation layer to define another opening in the another passivation layer.

14. The method of claim 13, wherein the formation of the pad structure comprises:
filling the another opening and covering the another passivation layer by a conductive layer; and
patterning the conductive layer to form the pad structure.

15. The method of claim 14, wherein the formation of the pad structure further comprises forming a barrier layer along a bottom surface and side walls of the another opening and an upper surface of the another passivation layer prior to the formation of the conductive layer.

16. A semiconductor structure comprising:
a bond pad over a substrate;
a first passivation layer over the substrate, wherein the bond pad extends along a top surface of the first passivation layer; and
a second passivation layer over a periphery of the bond pad and extending laterally over the first passivation layer, the second passivation layer having an opening exposing a bonding region of the bond pad, the bonding region is recessed with respect to the periphery of the bond pad, the second passivation layer having an upper surface and a lower surface, and an entirety of the upper surface being above the bond pad,
wherein a first vertical distance between the upper surface of the second passivation layer and a surface of the bonding region ranging from 30% to 40% of a second vertical distance between the lower surface of the second passivation layer and an upper surface of the periphery of the bond pad.

17. The semiconductor structure of claim 16, wherein the bond pad and another bond pad over the substrate have an in-line pitch ranging from 35 microns (μm) to 80 μm.

18. The semiconductor structure of claim 16, wherein the periphery of the bond pad has a width ranging from 1.0 μm to 32 μm.

19. The semiconductor structure of claim 16, wherein the opening has a width ranging from 28 μm to 88 μm.

20. The semiconductor structure of claim 16, wherein the second vertical distance ranges from 0.8 μm to 25 μm.

* * * * *